(12) United States Patent
Tatsumi

(10) Patent No.: US 8,487,381 B2
(45) Date of Patent: Jul. 16, 2013

(54) PROTECTION ELEMENT AND SEMICONDUCTOR DEVICE HAVING THE PROTECTION ELEMENT

(75) Inventor: Takaaki Tatsumi, Kanagawa (JP)

(73) Assignee: Sony Corporation, Tokyo (JP)

( * ) Notice: Subject to any disclaimer, the term of this patent is extended or adjusted under 35 U.S.C. 154(b) by 22 days.

(21) Appl. No.: 13/332,606

(22) Filed: Dec. 21, 2011

(65) Prior Publication Data

US 2012/0168867 A1    Jul. 5, 2012

(30) Foreign Application Priority Data

Jan. 5, 2011    (JP) .................... 2011-000806

(51) Int. Cl.
*H01L 23/62* (2006.01)
(52) U.S. Cl.
USPC ........... 257/355; 257/315; 257/339; 257/340; 257/360; 257/362
(58) Field of Classification Search
None
See application file for complete search history.

(56) References Cited

U.S. PATENT DOCUMENTS

2009/0085117 A1*    4/2009    Harada et al. ................. 257/360

OTHER PUBLICATIONS

Michael G. Khazhinsky et al.; Engineering Single NMOS and PMOS Output Buffers for Maximum Failure Voltage in Advanced CMOS Technologies; EOS/ESD Symposium; 2004.

* cited by examiner

*Primary Examiner* — Kyoung Lee
(74) *Attorney, Agent, or Firm* — Dentons US LLP

(57) ABSTRACT

Disclosed herein is a protection element for protecting a circuit element. The protection element includes source and drain areas created in a semiconductor layer, a gate created on the semiconductor layer, sandwiching a gate insulation film between the gate and the semiconductor layer, a source electrode connected to the surface of the source area and electrically connected to the ground, a drain electrode connected to the surface of the drain area and used for receiving a surge input, and a diode connected between the source electrode and the gate.

8 Claims, 5 Drawing Sheets

F I G . 3
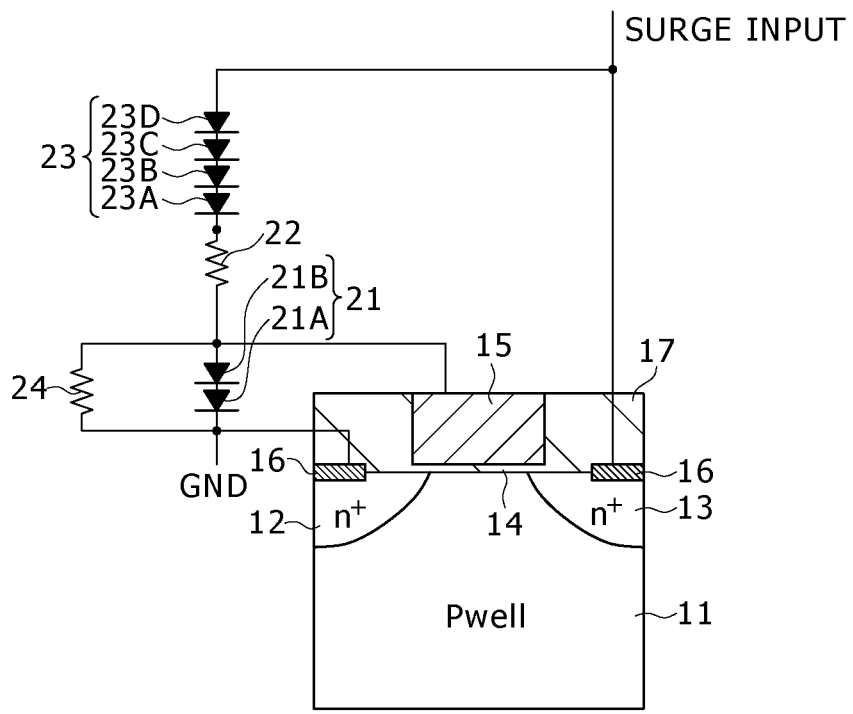
F I G . 4
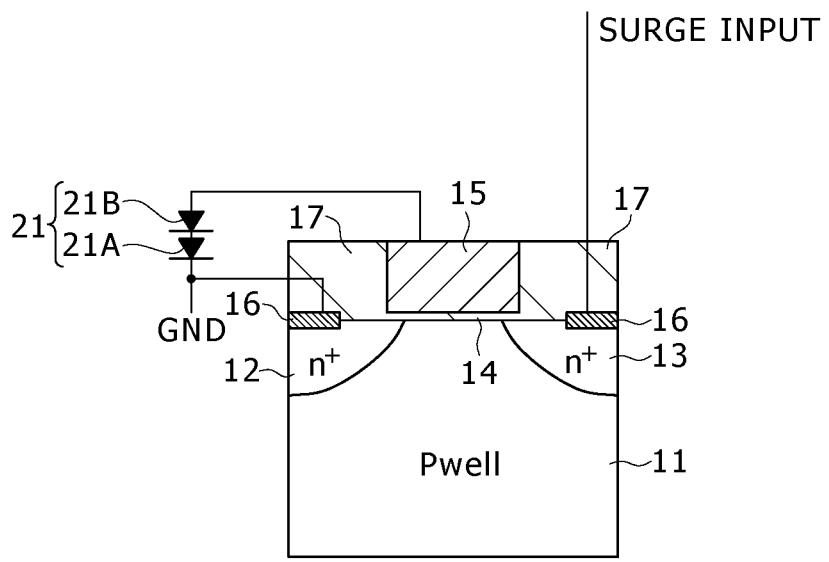

F I G . 5
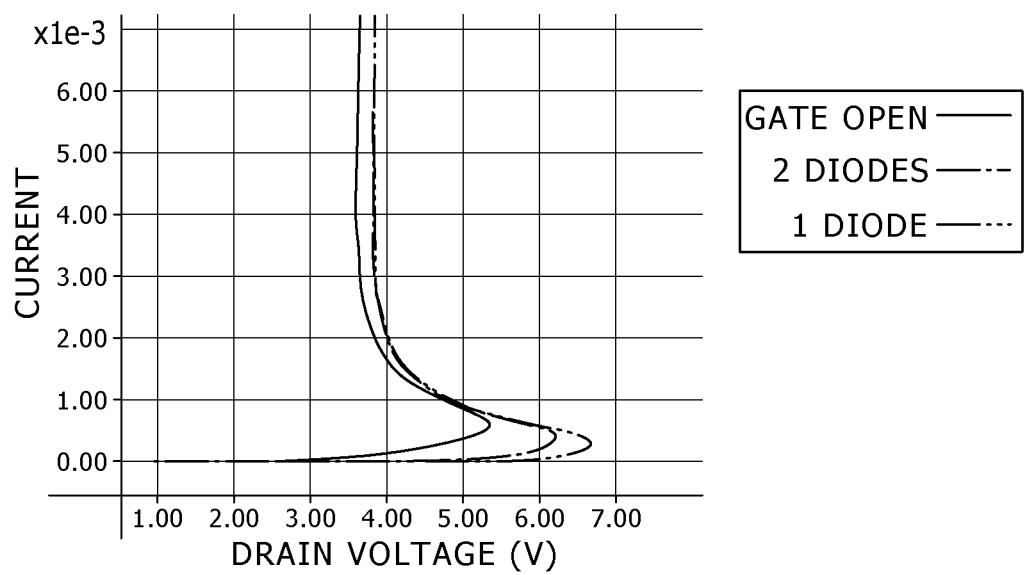

PROTECTION ELEMENT AND SEMICONDUCTOR DEVICE HAVING THE PROTECTION ELEMENT

BACKGROUND

The present disclosure relates to a protection element serving as a countermeasure against ESDs (Electro-Static Discharges) and a semiconductor device provided with the protection element.

As protection elements each serving as a countermeasure against ESDs, there are known a GGMOS (Gate Grounded MOS), a thyristor and an RC timer, to mention a few.

These protection elements are properly used in their respective applications. The GGMOS has a simple structure so that the GGMOS has been used for the longest period of time among these protection elements.

A typical structure of the GGMOS is shown in FIG. 7. FIG. 7 is a diagram showing a GGMOS device of the NMOS type. As shown in the figure, the GGMOS employs a PWell area 51, a source area 52, a drain area 53, a gate insulation film 54 and a gate 55.

As shown in FIG. 7, in comparison with an ordinary MOS transistor having the same structure, in the structure of the GGMOS, the gate 55 is shorted to the source area 52 and both are connected to the ground GND or the electric potential of the ground.

In the structure of the GGMOS, for a surge input coming from the drain, till an input voltage V represented by the horizontal axis attains a certain voltage level denoted by notation Vt1, the GGMOS does not work as shown in FIG. 8. That is to say, till the input voltage V attains the voltage level Vt1, a current I represented by the vertical axis does not flow. As the input voltage V attains the voltage level Vt1, a bipolar operation is started and the input voltage V drops so that the current I having a large magnitude flows.

In the ESD protection element having the related-art GGMOS structure, however, the voltage Vt1 has a specific value due to the GGMOS peculiar configuration such as the gate length and impurity concentrations in a variety of areas including the Well, the source and the drain.

Thus, depending on the application, in order to control the voltage Vt1 to a desired level, it is necessary to change the configuration of the protection element.

For raising the voltage Vt1, there are relatively simple methods such as increasing the gate length.

For reducing the voltage Vt1, there are known the following 3 methods:
(1) a method of changing the configuration of the protection element to an impurity configuration with a low withstanding voltage;
(2) a method of setting the electric potential of the Well area at a floated level; and
(3) a method of providing a circuit for controlling the gate voltage (refer to M. G. Khazhinskyet al., "Engineering Single NMOS and PMOS Output Buffers for Maximum Failure Voltage in Advanced CMOS technologies," EOS/ESD Symposium 2004, for example, referred to as Non-Patent Document 1 hereinafter).

As described in Non-Patent Document 1, changes of the voltage Vt1 caused by variations of the gate voltage are used as shown in FIG. 9. In addition, a circuit for controlling the gate voltage is provided at an input stage. This circuit detects a surge current and carries out control so that the gate voltage of the protection element becomes equal to the drain voltage.

Thus, in FIG. 9, Vgs=Vds. As a result, in comparison with the related-art configuration in which Vgs=0 V, the voltage Vt1 can be lowered.

SUMMARY

However, each of the above methods for lowering the voltage Vt1 raises problems described as follows.

First of all, in the case of method (1) of changing the configuration of the protection element to an impurity configuration with a low withstanding voltage, a process of manufacturing a portion of the protection element is modified.

In addition, if the impurity concentration in the PWell area varies between the protection element and the circuit element, it is necessary to create each of the PWell areas in separate processes, thereby increasing the number of processes.

In the case of method (2) of setting the electric potential of the Well area at a floated level, only two voltages Vt1 can be obtained, that is, the related-art voltage Vt1 and the voltage Vt1 for which the electric potential of the Well area is set at a floated level. That is to say, only two specific voltage magnitudes, i.e., a high voltage Vt1 and a low voltage Vt1 can be implemented.

In the case of method (3) of providing a circuit for controlling the gate voltage, the configuration of the circuit provided at the input stage to serve as a control circuit becomes complicated and a larger area is required for the circuit.

In addition, in accordance with the method disclosed in Non-Patent Document 1 described above, the gate voltage of the protection element becomes equal to the drain voltage. Thus, also in the case of this method, only two specific voltage magnitudes, i.e., a high voltage Vt1 and a low voltage Vt1 can be implemented.

According to an embodiment of the present disclosure, there is provided a protection element, which has a relatively simple configuration and is capable of setting the voltage Vt1 at any one of three or more levels, to serve as a countermeasure against ESDs (Electro-Static Discharges). There is also provided a semiconductor device having the protection element.

The protection element according to the embodiment of the present disclosure is a protection element for protecting a circuit element.

The protection element includes source and drain areas created in a semiconductor layer; a gate created on the semiconductor layer, sandwiching a gate insulation film between the gate and the semiconductor layer; a source electrode connected to the surface of the source area and electrically connected to the ground; a drain electrode connected to the surface of the drain area and used for receiving a surge input; and a diode connected between the source electrode and the gate.

A semiconductor device according to another embodiment of the present disclosure includes a circuit element and a protection element which has the configuration of the protection element described above and is connected to the circuit element.

In the configuration of the protection element according to the embodiment of the present disclosure, the diode is connected between the gate and the source electrode electrically connected to the ground. Thus, an electric potential appearing on the gate can be shifted from the ground so that the magnitude of the voltage Vt1 explained earlier can be changed.

In addition, according to the number of diodes connected between the gate and the source electrode, the electric potential appearing on the gate can be changed so that the magnitude of the voltage Vt1 can be changed in accordance with the change of the electric potential.

In the configuration of the semiconductor device according to the embodiment of the present disclosure, the protection element according to the embodiment of the present disclosure is connected to a circuit element. Thus, in the protection element, in accordance with the number of diodes connected between the gate and the source electrode, the electric potential appearing on the gate can be changed so that the magnitude of the voltage Vt1 can also be changed.

In the embodiments of the present disclosure described above, the voltage Vt1 can be changed according to the number of diodes connected between the gate and the source electrode. Thus, it is possible to set the voltage Vt1 at any one of three or more levels.

In addition, in comparison with the protection element having the related-art GGMOS configuration, it is also possible to make a protection element having a lower voltage Vt1.

The protection element according to the embodiment of the present disclosure has a configuration including a diode within the MOS structure. Thus, the diode can be embedded in the MOS structure during manufacturing the structure. As a result, since no additional process is required, the protection element can be made with ease in the process of manufacturing an ordinary MOS structure.

BRIEF DESCRIPTION OF THE DRAWINGS

FIG. 3 is a rough diagram showing a cross section of a configuration of a protection element according to a second embodiment of the present disclosure;

FIG. 4 is a rough diagram showing a cross section of a configuration of a protection element according to a third embodiment of the present disclosure;

FIG. 5 is a diagram showing results computed by the TCAD simulation regarding relations between the drain voltage and a current when the number of diodes varies in the configuration shown in FIG. 4;

DETAILED DESCRIPTION OF THE PREFERRED EMBODIMENTS

Preferred embodiments of the present disclosure are explained below. In the following description, each of the preferred embodiments is also referred to simply as an embodiment.

It is to be noted that the embodiments are explained in chapters arranged as follows:

1: First Embodiment
2: Second Embodiment
3: Third Embodiment
4: Fourth Embodiment
5: Modifications 1. First Embodiment FIG. 1 is a rough diagram showing a cross section of the configuration of a protection element according to a first embodiment of the present disclosure.

Figure 7:
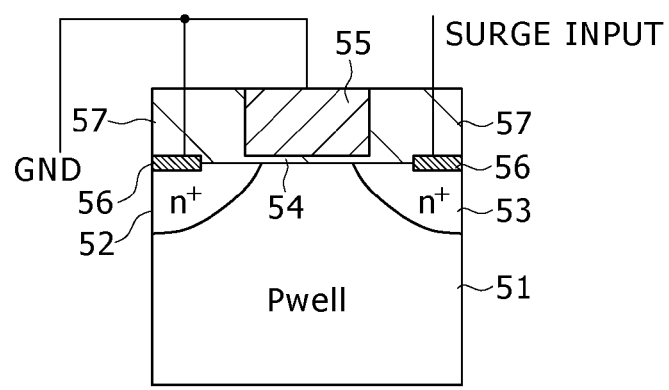
FIG. 7 is a cross section of a protection element having the related-art GGMOS structure.
Figure 8:
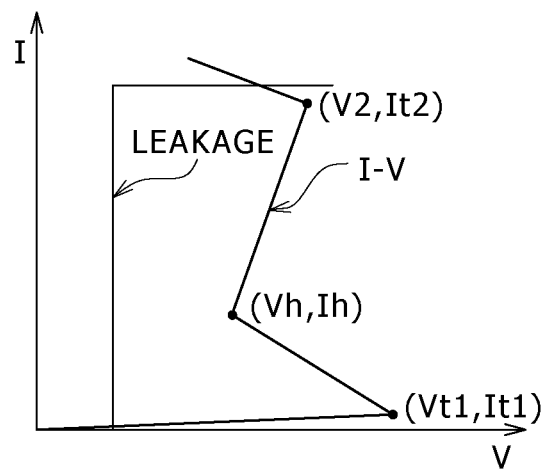
FIG. 8 is a diagram showing a relation between a surge input voltage and a leak current in the GGMOS structure.

Much like the protection element having the GGMOS structure shown in FIG. 7, the protection element according to the first embodiment is a protection element used as a countermeasure against ESDs (Electro-Static Discharges).

Figure 1:
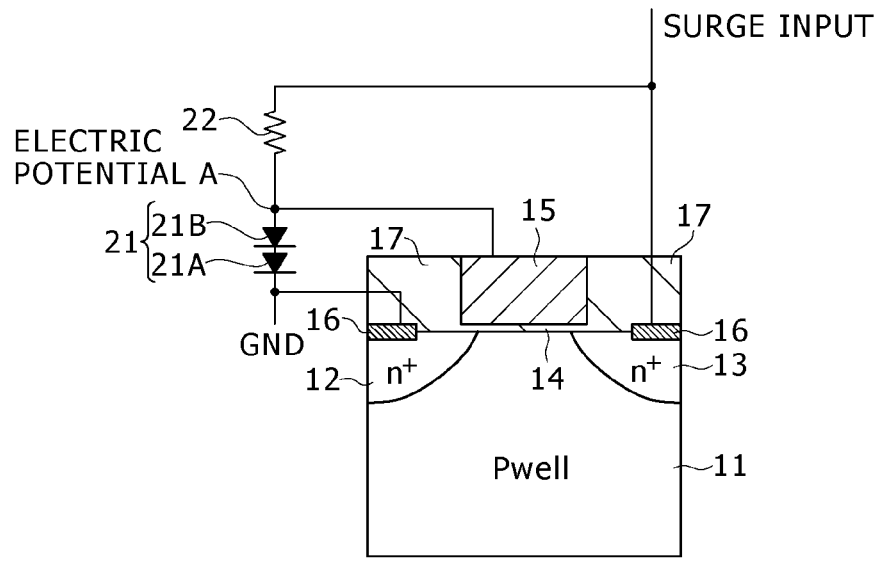
FIG. 1 is a rough diagram showing a cross section of the configuration of a protection element according to a first embodiment of the present disclosure.

As shown in FIG. 1, on the surface portion of a PWell area 11 created on a semiconductor layer such as a semiconductor substrate or an epitaxial layer, a source area 12 and a drain area 13 are created as $n^+$ impurity areas. Then, above the semiconductor layer between the source area 12 and the drain area 13, a gate 15 is created to sandwich a gate insulation film 14 between the semiconductor layer and the gate 15.

That is to say, the protection element has the same NMOS structure as an ordinary NMOS transistor.

Each of the source area 12 and the drain area 13 is connected to an electrode 16 provided on the surface of the semiconductor layer. In addition, portions above the electrodes 16 and portions outside the gate 15 are covered with an insulation layer 17.

In the protection element according to this embodiment, the electrode (source electrode) 16 connected to the source area 12 is also connected to the gate 15. Unlike the configuration shown in FIG. 7 in which the source electrode is electrically connected directly to the gate, the source electrode 16 is particularly connected to the gate 15 through two diodes 21 (21A and 21B).

The diodes 21A and 21B are connected in series between the gate 15 and the ground GND or a ground electric potential with their forward directions oriented toward the ground.

It is to be noted that, in the configuration described above, the source electrode 16 connected to the source area 12 is directly connected to the ground as is the case with the configuration shown in FIG. 7.

Thus, an electric potential appearing on the gate 15, which is equal to an electric potential A in FIG. 1, can be shifted from the ground in the positive direction by a voltage difference equal to a voltage drop along the diodes 21A and 21B.

Figure 9:
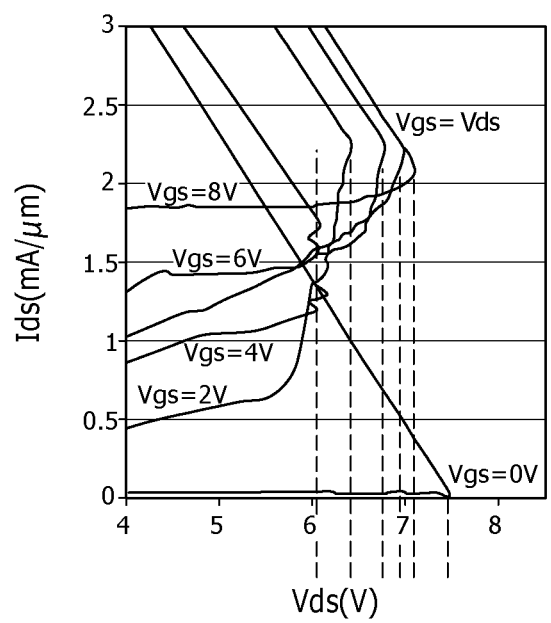
FIG. 9 is a diagram showing relations between the surge input voltage and the leak current for different magnitudes of the gate voltage in the GGMOS structure.

Since the electric potential appearing on the gate 15 can be shifted from the ground electric potential in the positive direction in this way, the voltage Vt1 can be reduced as is obvious from FIG. 9 explained earlier.

In addition, in the protection element according to this embodiment, the drain electrode 16 of the drain area 13 is, as an electrode for receiving a surge input, electrically connected to the gate 15 through a resistor 22.

With the drain electrode 16 electrically connected to the gate 15 through the resistor 22, the surge input is also supplied to the gate 15.

In addition, by electrically connecting the drain electrode 16 to the gate 15 through the resistor 22, the electric potential A supplied to the gate 15 can be made lower than the voltage of the surge input by a voltage drop along the resistor 22 in comparison with a configuration not including the resistor 22.

It is to be noted that, in the configuration not including the resistor 22, the resistance on the side of the diodes 21A and 21B becomes small so that most of the current flows to the diodes 21A and 21B. As a result, current does not flow between the source area 12 and the drain area 13, causing a snapback operation to be no longer carried out. If the number of diodes 21 is increased in order to make it difficult for the current to flow to the diodes 21, the snapback operation can be carried out. In such a configuration including more diodes 21, however, the electric potential appearing on the gate 15 becomes equal to the electric potential appearing on the drain area 13 unless the resistor 22 is provided. Thus, the voltage Vt1 can be set only at a fixed magnitude as is obvious from FIG. 9.

Each of the diodes has a simple structure which is a combination of P and N areas. When a MOS structure is made, in general, the diode can also be created at the same time as the MOS structure.

By the same token, in the process of making a MOS structure, a resistor can also be created at the same time as the MOS structure.

That is to say, in the protection element according to this embodiment, the diodes 21 (21A and 21B) as well as the resistor 22 can be created in other portions of the semiconductor layer. These other portions are portions separated from portions used for creating the PWell area 11, the source area 12 and the drain area 13 which are included in the NMOS structure of the protection element.

Thus, it is possible to create the diodes 21 (21A and 21B) as well as the resistor 22 without adding a special process to a process of manufacturing the portions of the NMOS structure of the protection element and manufacturing circuit elements provided with the protection element.

In particular, if the impurity concentrations of the P and N areas of the diodes 21 (21A and 21B) are the same as the impurity concentration of the circuit element or the impurity concentration of the PWell area 11, the source area 12, the drain area 13 or the like which are included in the protection element, the diodes 21 can be created at the same time as the component having the same impurity concentration.

Next, operations carried out by the protection element according to this embodiment are explained as follows.

First of all, when a high voltage is supplied to the protection element as a surge input, the high voltage is applied to the drain area 13 and the resistor 22 which are included in the NMOS structure. Thus, a voltage equal to or higher than the threshold voltage of the diodes 21A and 21B is applied to each of the diodes 21A and 21B, putting the diodes 21A and 21B in a conductive state. In the case of a silicon semiconductor layer, the threshold voltage is about 0.7 V.

At that time, the electric potential A shown in FIG. 1 is set at a level higher than the ground by an electric-potential drop along the diodes 21A and 21B. The electric-potential drop is calculated by multiplying 0.7 V by the number of diodes. For example, the electric potential A is sustained at 0.7 V when one diode is used and 1.4 V when two diodes are used like FIG. 1.

As is also obvious from FIG. 9 explained before, if the electric potential appearing on the gate 15 is raised from 0 V, the voltage Vt1 once decreases. As the electric potential appearing on the gate 15 is further raised, the voltage Vt1 conversely increases to a level lower than the level of the voltage Vt1 which is obtained when the electric potential appearing on the gate is set at 0 V.

In this way, the voltage Vt1 can be controlled in accordance with the number of diodes connected between the gate 15 and the ground.

If the gate is simply shorted to the drain, the voltage Vt1 becomes lower than that of the GGMOS and can be set only at one magnitude so that the voltage Vt1 cannot be controlled in a way according to the present disclosure.

It is to be noted that the resistance of the resistor 22 can be set with a high degree of freedom at any value as long as the value is smaller than the resistance when the diodes 21A and 21B are put in a nonconductive state but greater than a smallest possible resistance at which a current flows between the source area 12 and the drain area 13. The resistance when the diodes 21A and 21B are in a nonconductive state has an extremely high value.

In this case, a TCAD (Technology CAD) simulation has been carried out in order to predict operations which are carried out by the protection element according to this embodiment when a surge input is supplied to the protection element.

To put it more concretely, the simulation has been carried out for a structure including two diodes connected between the gate and the source as shown in FIG. 1 and a structure including one diode connected between the gate and the source. In addition, the same operations have also been predicted for the related-art GGMOS structure serving as a comparison structure.

Figure 2:
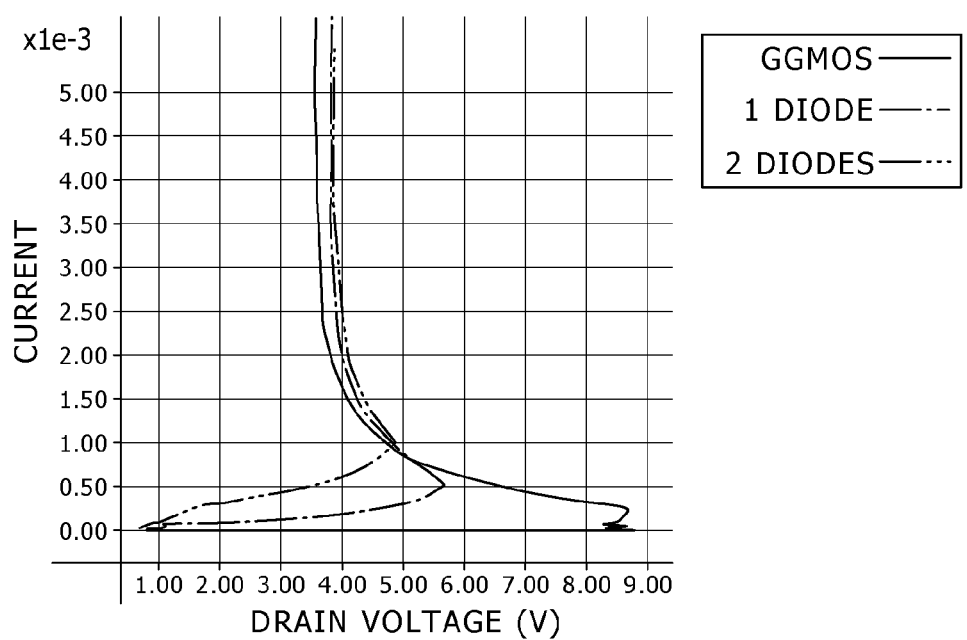
FIG. 2 is a diagram showing results computed by the TCAD (Technology Computer Aided Design) simulation regarding relations between the drain voltage and a current when the number of diodes varies in the configuration shown in FIG. 1.

FIG. 2 is a diagram showing the results representing relations between the drain voltage and a current flowing between the drain and the source for each of the structures.

As is obvious from the results shown in FIG. 2, in the case of the related-art GGMOS structure, the voltage Vt1 is 8.8 V. In the case of the structure including one diode in accordance with this embodiment, the voltage Vt1 is decreased to 5.7 V. In the case of the structure including two diodes in accordance with this embodiment, the voltage Vt1 is decreased to 4.8 V.

That is to say, it is confirmed possible to control the magnitude of the voltage Vt1 in accordance with the number of diodes.

In the configuration of the protection element according to the embodiment, the gate 15 is connected to the source electrode 16 of the source area 12 through the two diodes 21A and 21B.

Thus, since the electric potential A appearing on the gate 15 can be shifted from the ground in the positive direction, the voltage Vt1 can be reduced.

In addition, the number of diodes is not limited to two as is the case with the configuration shown in FIG. 1. For example, the number of diodes can also be one or three or an integer greater than 3. By changing the number of diodes, it is possible to change the electric potential appearing on the gate 15 and, hence, the voltage Vt1.

Since the voltage Vt1 can be changed by changing the number of diodes as described above, it is possible to set the voltage Vt1 at any one of three or more levels. In the case of the results shown in FIG. 2 for example, the voltage Vt1 can be set at 8.8 V, 5.7 V or 4.8 V.

In addition, in the configuration of the protection element according to the embodiment, through the resistor 22, the gate 15 is electrically connected to the drain electrode 16 of the drain area 13 receiving the surge input.

Thus, the electric potential A appearing on the gate 15 can be made lower than the voltage of the surge input by a voltage difference equal to a voltage drop along the resistor 22.

In the protection element according to this embodiment, the diodes 21 and the resistor 22 are merely added to the NMOS structure so that the diodes 21 and the resistor 22 can be embedded in the MOS structure during a process of manufacturing the structure.

That is to say, the protection element according to this embodiment does not require an additional process and can thus be created with ease by carrying out the ordinary process of making an MOS structure.

By making use of the protection element according to this embodiment, it is possible to create a semiconductor device having the protection element.

For example, in the periphery of a circuit element configuring the semiconductor device, the protection element according to this embodiment is provided as an element for receiving a surge input.

2. Second Embodiment

In the configuration of the first embodiment shown in FIG. 1, in a normal operating state where a voltage Vdd around the range from 1.8 V to 5 V is applied to the drain area 13, the diodes 21 conduct, setting the electric potential A shown in the figure at a level calculated by multiplying 0.7 V by the number of diodes.

At that time, the channel of the MOS structure is opened, allowing a current to leak from the drain area 13 to the source area 12. Thus, an electric power corresponding to the leak current is consumed.

A configuration for preventing the leak current from flowing is implemented as a second embodiment described as follows.

FIG. 3 is a rough diagram showing a cross section of a configuration of a protection element according to the second embodiment of the present disclosure.

As shown in the figure, in particular, this embodiment has a configuration in which diodes 23 and a resistor 24 are provided in addition to the diodes 21 and the resistor 22 shown in FIG. 1.

The diodes 23 are connected in series between the drain electrode 16 of the drain area 13 and the resistor 22 with their forward directions oriented toward the ground in the same way as the two diodes 21A and 21B. The diodes 23 include four diodes 23A, 23B, 23C and 23D.

The resistor 24 is connected between the gate 15 and the source electrode 16 of the source area 12 in parallel to the diodes 21.

In FIG. 3, the diodes 21 include the two diodes 21A and 21B, and the diodes 23 include the four diodes 23A, 23B, 23C and 23D. It is to be noted, however, that the number of diodes 21 and 23 can be changed if necessary.

In addition, the diodes 23 are provided on the surge-input side of the resistor 22 in FIG. 3. However, it is possible to provide a configuration in which the resistor 22 is conversely provided on the surge-input side of the diodes 23.

Next, operations carried out by the protection element according to this embodiment are explained as follows.

In a normal operating state in which the drain voltage is set at the power-supply voltage Vdd of 2.7 V, the drain voltage is lower than the threshold voltage (0.7 V×4 diodes=2.8 V) for the diodes 23. Thus, the diodes 23 do not conduct. At that time, the gate electric potential is 0 V. Thus, the channel is closed and no leak current flows.

As the drain voltage further increases, the diodes 23 conduct, and thereby a current flows through a route including the diodes 23, the resistor 22, the resistor 24 and the ground. At that time, the gate voltage increases to a level of I×R2, where notation I denotes the magnitude of the current and notation R2 denotes the resistance of the resistor 24.

As the current I further increases, the gate voltage I×R2 puts the diodes 21 in a conductive state.

The electric potential appearing at that time on the gate 15 is the gate voltage putting the diodes 21 in a conductive state, that is 0.7 V×2 diodes=1.4 V in the case of FIG. 3.

It is to be noted that, even if the drain voltage further increases, the gate electric potential is sustained at 1.4 V.

Even if the operating voltage is a voltage other than 2.7 V, the required number of diodes of the diodes 23 can be determined so that the total threshold voltage of the diodes 23 is higher than the operating voltage.

As described above, the diodes 23 connected between the drain and the gate 15 set the gate electric potential at 0 V in a state in which the drain voltage is lower than the voltage at which the diodes 23 can conduct. Thus, in this state, it is possible to prevent a leak current from flowing between the source area 12 and the drain area 13.

Since the other components of the configuration are identical with those of the first embodiment shown in FIG. 1, the other components are denoted by the same reference numerals as the first embodiment and it is thus abbreviated to again explain the other components.

In the configuration of the protection element according to the embodiment, the gate 15 is connected to the source electrode 16 of the source area 12 through the two diodes 21 (21A and 21B) and the resistor 24.

Thus, in the same way as the first embodiment, the electric potential A of the gate 15 can be shifted to a positive electric potential from the ground. As a result, the voltage Vt1 can be lowered.

In addition, the number of diodes 21 is not limited to two as shown in FIG. 3. For example, the number of diodes 21 can also be one or three or an integer greater than three. By changing the number of diodes, it is possible to change the electric potential appearing on the gate 15 and, hence, the voltage Vt1.

Since the voltage Vt1 can be changed by changing the number of diodes as described above, it is possible to set the voltage Vt1 at any one of three or more levels according to the number of diodes.

In addition, in the configuration of the protection element according to the embodiment, through the resistor 22 as well as the diodes 23A, 23B, 23C and 23D, the gate 15 is electrically connected to the drain electrode 16 of the drain area 13 for receiving the surge input.

Thus, the electric potential A appearing on the gate 15 can be made lower than the voltage of the surge input.

In the protection element according to this embodiment, the diodes 21, the diodes 23, the resistor 22 and the resistor 24 are merely added to the NMOS structure so that the diodes 21, the diodes 23, the resistor 22 and the resistor 24 can be embedded in the MOS structure during a process of manufacturing the structure.

That is to say, the protection element according to this embodiment does not require an additional process and can thus be created with ease by carrying out the ordinary process of making an MOS structure.

In addition, in the protection element according to this embodiment, the diodes 23 are connected between the resistor 22 and the surge input, and the resistor 24 is connected in parallel to the diodes 21. Thus, the electric potential on the gate 15 remains at 0 V in a state in which the operating voltage is lower than the total threshold voltage of the diodes 23. As a result, in this state, it is possible to prevent a leak current from flowing between the source area 12 and the drain area 13 and hence to prevent electric power from being consumed due to a flowing leak current.

In addition, by making use of the protection element according to this embodiment, it is possible to create a semiconductor device having the protection element.

For example, in the periphery of a circuit element configuring the semiconductor device, the protection element according to this embodiment is provided as an element for receiving a surge input.

3. Third Embodiment

FIG. 4 is a rough diagram showing a cross section of a configuration of a protection element according to a third embodiment of the present disclosure.

In general, when a high voltage is applied to a MOS drain, the voltage of the gate also rises as well.

In the embodiment, this phenomenon is used as follows. As shown in FIG. 4, the gate 15 is not electrically connected to the drain. The gate 15 is connected only to the ground through the diodes 21 (21A and 21B).

By configuring this embodiment as described above, when a surge input is applied to the drain, the electric potential appearing on the gate 15 makes an attempt to rise but the electric potential is clamped at a level by the diodes 21 (21A and 21B). Thus, the electric potential appearing on the gate 15 is prevented from rising beyond the clamped level.

Since the other components of the configuration are identical with those of the first embodiment shown in FIG. 1, the other components are denoted by the same reference numerals as the first embodiment and it is thus abbreviated to again explain the other components.

In this case, a TCAD (Technology CAD) simulation has been carried out in order to predict operations which are carried out by the protection element according to this embodiment when a surge input is supplied to the protection element.

To put it more concretely, the simulation has been carried out for a structure including two diodes connected between the gate and the source as shown in FIG. 4 and a structure including one diode connected between the gate and the source. In addition, the same operations have also been predicted for a structure in which the number of diodes is extremely large to practically result in a gate-open state.

FIG. 5 is a diagram showing the results representing relations between the drain voltage and a current flowing between the drain and the source for each of the structures.

As is obvious from the results shown in FIG. 5, the voltage Vt1 varies in accordance with the number of diodes. The voltage Vt1 of the related-art GGMOS structure is 8.8 V as shown in FIG. 2. In the case of the structure including one diode in accordance with this embodiment, the voltage Vt1 is 6.8 V. In the case of the structure including two diodes in accordance with this embodiment, the voltage Vt1 is 6.2 V. The Vt1 values of these two cases in this embodiment are closer to the voltage Vt1 of 5.3 V in the gate-open state, when comparing to the voltage Vt1 of the GGMOS structure shown in FIG. 2.

In comparison with the first embodiment shown in FIG. 1 and the second embodiment shown in FIG. 3, the Vt1 quantity controlled by the changes in the number of diodes decreases in the configuration of the third embodiment. However, the third embodiment offers a merit that, by making use of a similar circuit, it is possible to prevent a leak current from being generated. In addition, since the Vt1 quantity controlled by the changes in the number of diodes decreases, the third embodiment is more appropriate for an application in which the voltage Vt1 is to be finely controlled.

In the configuration of the protection element according to the embodiment, the gate 15 is connected to the source electrode 16 of the source area 12 through the two diodes 21 (21A and 21B).

Thus, in the same way as the first embodiment, the electric potential A of the gate 15 can be shifted to a positive electric potential from the ground and the voltage Vt1 can therefore be reduced.

In addition, the number of diodes 21 is by not limited to two as shown in FIG. 4. For example, the number of diodes 21 can also be one or three or an integer greater than three. By changing the number of diodes, it is possible to change the electric potential appearing on the gate 15 and, hence, the voltage Vt1.

Since the voltage Vt1 can be changed by changing the number of diodes as described above, it is possible to set the voltage Vt1 at any one of three or more levels according to the number of diodes.

In addition, in the configuration of the protection element according to the embodiment, the gate 15 is not electrically connected to the drain electrode 16 of the drain area 13 which receives the surge input.

Thus, the electric potential A appearing on the gate 15 makes an attempt to rise corresponding to the voltage rise in the surge input, but the electric potential is clamped at a certain level by the diodes 21. As a result, the electric potential appearing on the gate 15 is prevented from rising beyond the certain level.

In the protection element according to this embodiment, the diodes 21 are merely added to the NMOS structure so that the diodes 21 can be embedded in the MOS structure during a process of manufacturing the structure.

That is to say, the protection element according to this embodiment does not require an additional process and can thus be created with ease by carrying out the ordinary process of making an MOS structure.

By making use of the protection element according to this embodiment, it is possible to create a semiconductor device having the protection element.

For example, in the periphery of a circuit element configuring the semiconductor device, the protection element according to this embodiment is provided as an element for receiving a surge input.

4. Fourth Embodiment

Figure 6:
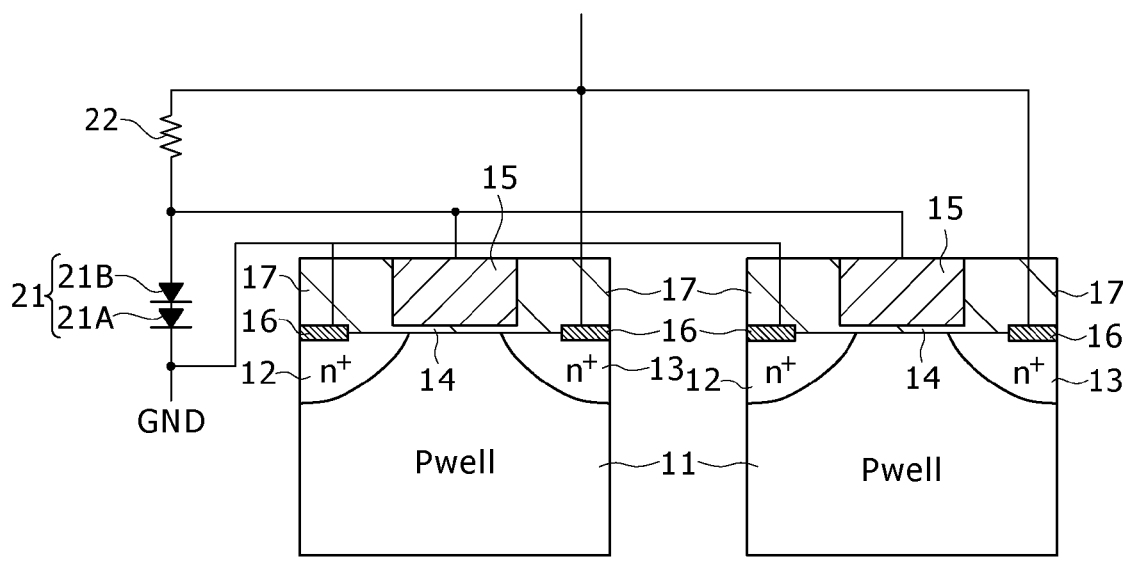
FIG. 6 is a rough diagram showing a cross section of a configuration of a protection element according to a fourth embodiment of the present disclosure.

FIG. 6 is a rough diagram showing a cross section of a configuration of a protection element according to a fourth embodiment of the present disclosure.

In this embodiment, as shown in FIG. 6, the protection element includes two NMOS structures which are each identical with that of the first embodiment shown in FIG. 1. The diodes 21 and resistor 22 are provided as components common to the two NMOS structures.

In this way, by making use of a set including diodes 21 and a resistor 22, a plurality of MOS gates can be controlled. Thus, the configuration of the fourth embodiment is simpler than a configuration in which the gates of a plurality of protection elements are each provided with a set including of diodes 21 and a resistor 22.

In the configuration shown in FIG. 6, two MOS gates are controlled by making use of a set including diodes 21 and a resistor 22. It is to be noted, however, that, a set including diodes 21 and a resistor 22 can be used for controlling three or more MOS gates.

Since the other components of the configuration are identical with those of the first embodiment shown in FIG. 1, the other components are denoted by the same reference numerals as the first embodiment and it is thus abbreviated to again explain the other components.

In the configuration of the protection element according to the embodiment, the gate 15 is connected to the source electrode 16 of the source area 12 through the two diodes 21 (21A and 21B).

Thus, in the same way as the first embodiment, the electric potential A of the gate 15 can be shifted to a positive electric potential from the ground, and the voltage Vt1 can therefore be reduced.

In addition, the number of diodes is not limited to two as shown in FIG. 6. For example, the number of diodes can also be one or three or an integer greater than three. By changing the number of diodes, it is possible to change the electric potential appearing on the gate 15 and, hence, the voltage Vt1.

Since the voltage Vt1 can be changed by changing the number of diodes as described above, it is possible to set the voltage Vt1 at any one of three or more levels according to the number of diodes.

In addition, in the configuration of the protection element according to the embodiment, the gate 15 is electrically connected to the drain electrode 16 of the drain area 13 which receives the surge input, through the resistor 22.

Thus, the electric potential A appearing on the gate 15 can be made lower than the voltage of the surge input in the same way as the first embodiment.

In the protection element according to this embodiment, the diodes 21 and the resistor 22 are merely added to the NMOS structure so that the diodes 21 and the resistor 22 can be embedded in the MOS structure during a process of manufacturing the structure.

That is to say, the protection element according to this embodiment does not require an additional process and can thus be created with ease by carrying out the ordinary process of making an MOS structure.

By making use of the protection element according to this embodiment, it is possible to create a semiconductor device having the protection element.

For example, in the periphery of a circuit element configuring the semiconductor device, the protection element according to this embodiment is provided as an element for receiving a surge input.

In FIG. 6, the configurations of the diodes 21 and the resistor 22 are made identical with those of the first embodiment shown in FIG. 1.

The configurations of diodes and resistors can also be made identical with those of the second embodiment shown in FIG. 3 or the third embodiment shown in FIG. 4 so that a plurality of MOS gates can be controlled.

5. Modifications

Each of the embodiments described above applies the present disclosure to an NMOS structure. However, the present disclosure can also be applied to a PMOS structure.

In an application of the present disclosure to a PMOS structure, diodes are provided between the gate and the source area in the same way as an NMOS structure. In the PMOS structure, however, a negative voltage is applied to the gate. Thus, the forward directions of the diodes provided between the gate and the source area in the PMOS structure are oriented in a direction opposite to the direction in the NMOS structure. The direction opposite to the direction in the NMOS structure is a direction from the ground to the gate.

In addition, in a semiconductor device wherein a protection element is connected to a circuit element, it is possible to provide a configuration in which a plurality of protection elements are provided and the protection elements include two or more protection elements having voltages Vt1 different from each other.

In this case, the two or more protection elements having voltages Vt1 different from each other can be made by changing the number of diodes included in each of the protection elements. It is not necessary to add processes in order to separately create the MOS structures having voltages Vt1 different from each other. Thus, the manufacturing time and cost can be cut down.

It is to be noted that, when configuring a semiconductor device by making use of a protection element according to any of the embodiments described above, the protection element can be connected to a circuit element of the semiconductor device in the same way as the connection between a protection element having the related-art GGMOS structure and a circuit element. For example, the drain side of the protection element is connected to the front of a circuit element of a wire conveying a surge input.

The present disclosure contains subject matter related to that disclosed in Japanese Priority Patent Application JP 2011-000806 filed in the Japan Patent Office on Jan. 5, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A protection element for protecting a circuit element, said protection element comprising:
   source and drain areas created in a semiconductor layer;
   a gate insulation layer;
   a gate created on said semiconductor layer, said gate sandwiching said gate insulation film between said gate and said semiconductor layer;
   a source electrode connected to the surface of said source area and electrically connected to the ground;
   a drain electrode connected to the surface of said drain area and used for receiving a surge input; and
   a diode connected between said source electrode and said gate.

2. The protection element according to claim 1, wherein a plurality of said diodes are connected in series oriented in the same direction.

3. The protection element according to claim 1, said protection element further including a resistor connected between said drain electrode and said gate.

4. The protection element according to claim 3, said protection element further including a second resistor connected in parallel to said diode and a second diode connected in series with said resistor.

5. The protection element according to claim 1, wherein said diode is connected to a plurality of sets including said gate and said source electrode to serve as a diode common to said sets.

6. A semiconductor device comprising a circuit element and a protection element for protecting said circuit element, said protection element comprising:
   source and drain areas connected to said circuit element and created in a semiconductor layer;
   a gate insulation layer;
   a gate created on said semiconductor layer, said gate sandwiching said gate insulation film between said gate and said semiconductor layer;
   a source electrode connected to the surface of said source area and electrically connected to the ground;
   a drain electrode connected to the surface of said drain area and used for receiving a surge input; and
   a diode connected between said source electrode and said gate.

7. The semiconductor device according to claim 6, wherein said protection element further includes a resistor connected between said drain electrode and said gate.

8. The semiconductor device according to claim 7, wherein said protection element further includes a second resistor connected in parallel to said diode and a second diode connected in series with said resistor.

* * * * *